US007170651B2

(12) United States Patent
Okamura

(10) Patent No.: US 7,170,651 B2
(45) Date of Patent: Jan. 30, 2007

(54) IMAGE READER

(75) Inventor: Keiichi Okamura, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 828 days.

(21) Appl. No.: 10/131,471

(22) Filed: Apr. 25, 2002

(65) Prior Publication Data

US 2002/0171879 A1 Nov. 21, 2002

Related U.S. Application Data

(63) Continuation-in-part of application No. PCT/JP01/07440, filed on Aug. 29, 2001.

(30) Foreign Application Priority Data

Aug. 29, 2000 (JP) ............................. 2000-259144

(51) Int. Cl.
*H04N 1/04* (2006.01)

(52) U.S. Cl. ...................... 358/474; 358/486; 358/506; 358/512; 348/294; 348/303

(58) Field of Classification Search ................ 358/474, 358/486, 506, 512, 513, 530; 348/294, 222, 348/303
See application file for complete search history.

(56) References Cited

U.S. PATENT DOCUMENTS 4,298,859 A * 11/1981 Feilchenfeld ................ 235/456
5,517,333 A * 5/1996 Tamura et al. ............... 358/518
5,627,603 A * 5/1997 Sakai .......................... 348/708
6,031,569 A * 2/2000 Nobuoka et al. ........ 348/220.1
6,444,967 B1 * 9/2002 Kosuge et al. ............ 250/201.3
6,452,632 B1 * 9/2002 Umeda et al. ............... 348/294
2003/0038885 A1* 2/2003 Rodriguez ................. 348/222.1

FOREIGN PATENT DOCUMENTS

| JP | A 2-202773 | 8/1990 |
| JP | A 5-83645 | 4/1993 |
| JP | A 2000-125120 | 4/2000 |
| JP | A 2000-152008 | 5/2000 |
| JP | A 2000-307852 | 11/2000 |
| JP | A 2001-268355 | 9/2001 |

* cited by examiner

*Primary Examiner*—Douglas Q. Tran
*Assistant Examiner*—Negussie Worku
(74) *Attorney, Agent, or Firm*—Oliff & Berridge, PLC

(57) ABSTRACT

In an image reader, delay circuits are disposed on connection lines connecting an A/D converter with an image data generation circuit, whereby the output timings of the digital electric signals output from the A/D converter differ. Thus, the digital electric signals are not output at the same time from the adjacent output terminals of the A/D converter. Thus, the digital electric signals output from the A/D converter do not make a low to high or high to low transition at the same time and amplifying of EMI is decreased. Therefore, noise can be prevented from being contained in image data generated by the image data generation circuit and the quality of the image read through the image reader can be improved.

5 Claims, 4 Drawing Sheets

IMAGE READER

BACKGROUND OF THE INVENTION

This invention relates to an image reader.

Generally, an image reader for reading an original of paper, etc., placed on a transparent original bed of glass, etc., and outputting image data has been known. The image reader converts light from the original into an electric signal by using a line sensor as image pickup device comprising photoelectric conversion elements such as CCD placed linearly in a main scanning direction. The electric signal output from the line sensor is an analog electric signal and thus is converted into a digital signal by an A/D conversion section. The digital electric signal is subjected to various corrections of gamma correction, shading correction, etc., and then is output to a personal computer, etc., outside the image reader as digital image data.

To read a color image through the image reader, analog electric signals of colors of R, G, and B are input to the A/D conversion section from the line sensor. The input color signals are output from the A/D conversion section as digital electric signals in synchronization with the timing of a clock signal supplied to the A/D conversion section.

For example, to use an image reader with 12-bit output of each color, an A/D conversion section 100 is provided with 12 pins of D0 to D11 as output pins, as shown in FIG. 4. The A/D conversion section 100 and an image data generation section 110 are connected through connection lines 120.

Assume that the D0 to D7 pins output high digital electric signals at the same time as output gradation corresponding to the analog electric signals input to the A/D conversion section 100 at one clock signal. Assume that the D0 to D2 pins output high digital signals and the D3 to D11 pins output low digital signals as output gradation of the A/D conversion section 100 corresponding to the next clock signal.

At this time, the D0 to D2 pins hold the digital electric signals high. In contrast, the D3 to D7 pins make a high to low transition and the D8 to D11 pins hold the digital electric signals low.

By the way, the digital electric signal output from the A/D conversion section 100 is a high frequency. Accordingly, when the output digital electric signal makes a high to low transition or a low to high transition, electromagnetic radiation noise (EMI) occurs from the A/D conversion section 100. Particularly, if the digital electric signals output from the adjacent pins of the A/D conversion section 100, such as D1 and D2 or D2 and D3, make a high to low transition or a low to high transition at the same time in synchronization with the clock signal, a problem of amplifying EMI and increasing noise is involved.

When EMI occurs, it is feared that the digital image data may contain noise and the quality of the image read through the image reader is degraded; this is a problem.

To prevent EMI from occurring, a method of providing an EMI filter, putting a shield on wiring, or the like is possible. However, a member such as the EMI filter or the shield is added, the structure becomes complicated and the space for placing the member needs to be provided and problems of upsizing the image reader and an increase in the cost accompanying the added member are involved.

SUMMARY OF THE INVENTION

Then, it is an object of the invention to provide an image reader for decreasing EMI in a simple structure and at a low cost without being upsized and improving the quality of a read image.

According to the image reader of the invention, delay circuits for making different output timings of the digital electric signals output from an A/D conversion section are placed between the A/D conversion section and an image data generation section. Thus, the adjacent pins differ in the output timing of the digital electric signal output from the A/D conversion section. Consequently, if the digital electric signal output from the A/D conversion section make a high to low or low to high transition at the adjacent output pins, EMI is not amplified and EMI which occurs can be decreased.

Since EMI can be decreased by placing the delay circuits, it is not necessary to add an EMI filter, a wiring shield, etc., for example.

Therefore, EMI can be decreased in a simple structure and at a low cost without being upsized the image reader. As EMI is decreased, noise contained in the image data is decreased and the quality of a read image can be improved.

According to the image reader of the invention, each of the delay circuits is placed on alternate lines of connection lines connecting the output pins and the image data generation section. Thus, the output timings of the digital electric signals are made different between the adjacent pins and amplifying of EMI can be decreased. Since the number of the placed delay circuits can be decreased, an increase in the cost can be suppressed.

According to the image reader of the invention, each of the delay circuits has a resistance element and a capacitor element. Since the resistance elements and the capacitor elements are inexpensive, an increase in the cost can be suppressed as the delay circuits are placed. Since the resistance elements and the capacitor elements are small, the delay circuits can be easily placed on the board of the image reader itself or the AID conversion section and upsizing the image reader can be prevented.

According to the image reader of the invention, the resistance elements of the delay circuits have the same resistance and the capacitance elements of the delay circuits have the same capacitance. Thus, the delay circuits can be easily configured. Therefore, an increase in the cost of the image reader can be suppressed.

DETAILED DESCRIPTION OF PREFERRED EMBODIMENTS

An embodiment for carrying out the invention will be described with reference to the accompanying drawings.

Figure 2:
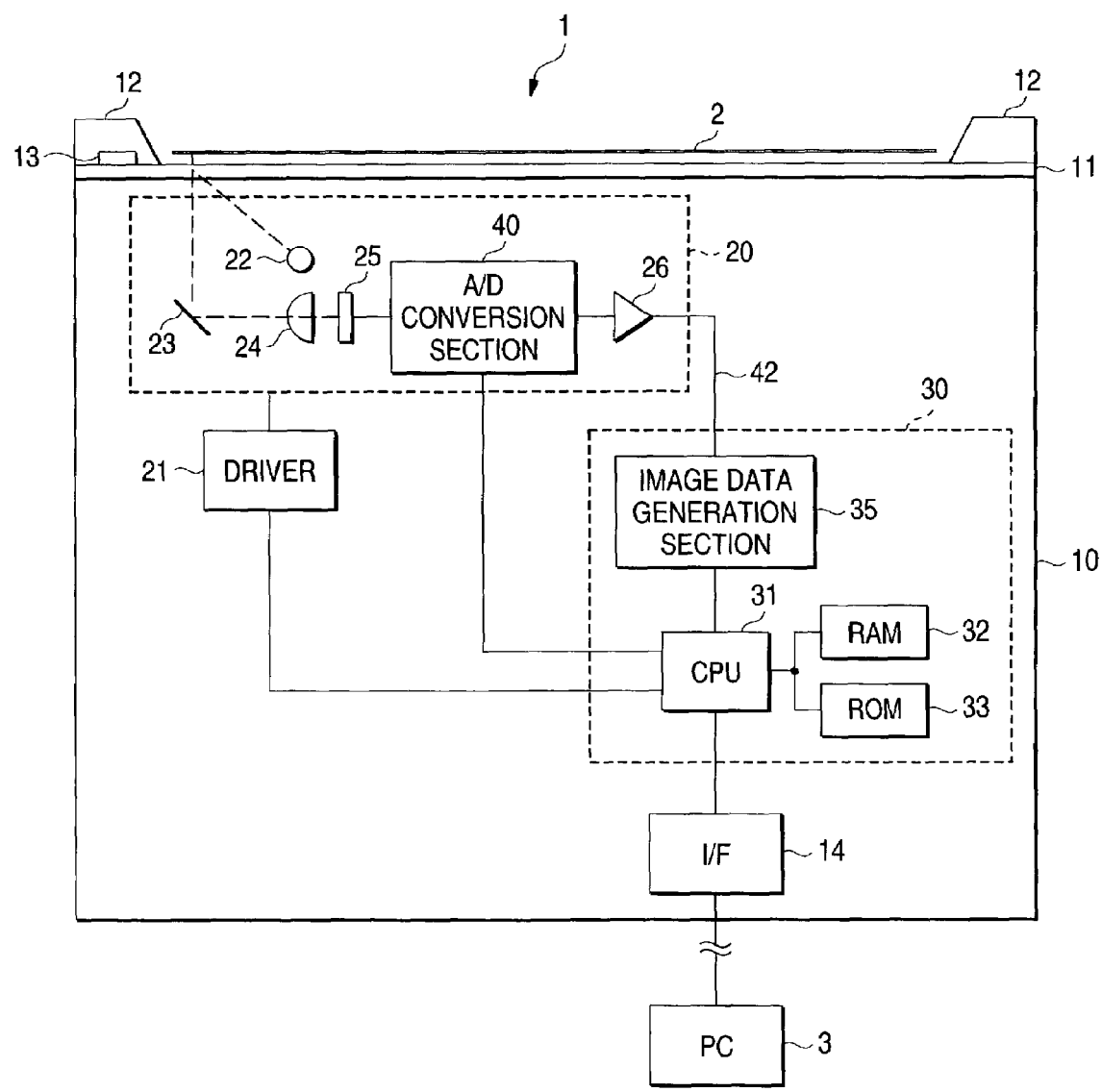
FIG. 2 is a schematic block diagram to show the image reader according to the embodiment of the invention.

FIG. 2 shows an image reader according to an embodiment of the invention. An image reader 1 according to the embodiment is an image reader of flat bed type.

As shown in FIG. 2, the image reader 1 comprises a carriage 20 in a main unit 10 shaped like a box. An original bed 11 is placed on the top of the main unit 10. An original 2 to be read is placed on the side of the original bed 11 opposite to the carriage 20. The main unit 10 contains the carriage 20 that can be reciprocated by a driver 21 in a subscanning direction in parallel with the original bed 11.

A light source 22, a mirror 23, a condensing lens 24, a line sensor 25 as an image pickup device, an A/D conversion section 40, and a buffer 26 are installed in the carriage 20. The mirror 23 is provided for reflecting light from the original 2 gathered on the line sensor 25 and lengthening an optical path. The condensing lens 24 gathers light from the original 2 on the line sensor 25. The line sensor 25 uses a charge-storage optical sensor comprising a plurality of pixels of CCD, etc., arranged linearly perpendicularly to the move direction of the carriage 20.

The light source 22 is placed perpendicularly to the move direction of the carriage 20; a fluorescent lamp, etc., is used. Light applied from the light source 22 is reflected on the surface of a reflection original, such as paper, and is made incident on the line sensor 25. The A/D conversion section 40 converts an analog electric signal output from the line sensor 25 into a digital electric signal. The buffer 26 enhances the drive capability of the digital electric signal output from the A/D conversion section 40.

The original bed 11 is surrounded by an original guide 12 for positioning the placement position of the read original 2 and regulating a move of the original 2 at the original read time. A white reference 13 having a high-reflectivity uniform reflection face is placed at an end of the original bed 11 in the carriage move direction.

A data processing section 30 is installed in the main unit 10. The data processing section 30 is made up of a CPU (central processing unit) 31, RAM (random access memory) 32, ROM (read-only memory) 33, and an image data generation section 35. The CPU 31 performs control of the whole image reader, such as drive control of the carriage 20, on/off control of the light source 22, and processing of image data generated by the image data generation section 35. The RAM 32 temporarily stores image data read through the line sensor 25 and the like. The ROM 33 stores a computer program for the CPU 31 to control the sections of the image reader 1.

The image data generation section 35 is made up of a shading correction section, a gamma correction section, and other correction sections (not shown). The shading correction section uses data provided by reading the white reference 13 before read is started to correct variations in sensitivities of the pixels of the line sensor 25 or variations in light amounts of the light source 22 in the main scanning direction. The gamma correction section makes gamma correction using a predetermined gamma function and converts a digital light amount signal subjected to the shading correction into digital image data. Other correction sections perform color correction, edge enhancement, area scaling up/down, and the like.

The digital image data generated by the image data generation section 35 is output from an interface 14 of the main unit 10 to an image processing apparatus such as a personal computer 3 externally connected.

Next, the A/D conversion section 40 and a delay circuit 50 placed between the A/D conversion section 40 and the image data generation section 35 will be described.

The A/D conversion section 40 converts an analog electric signal into a digital electric signal. The analog electric signal output from the line sensor 25 is a voltage value indicating the amount of charges stored in each of the pixels making up the line sensor 25. For the image data generation section 35 to generate digital image data, the analog electric signal output from the line sensor 25 needs to be converted into a digital electric signal.

Figure 1:
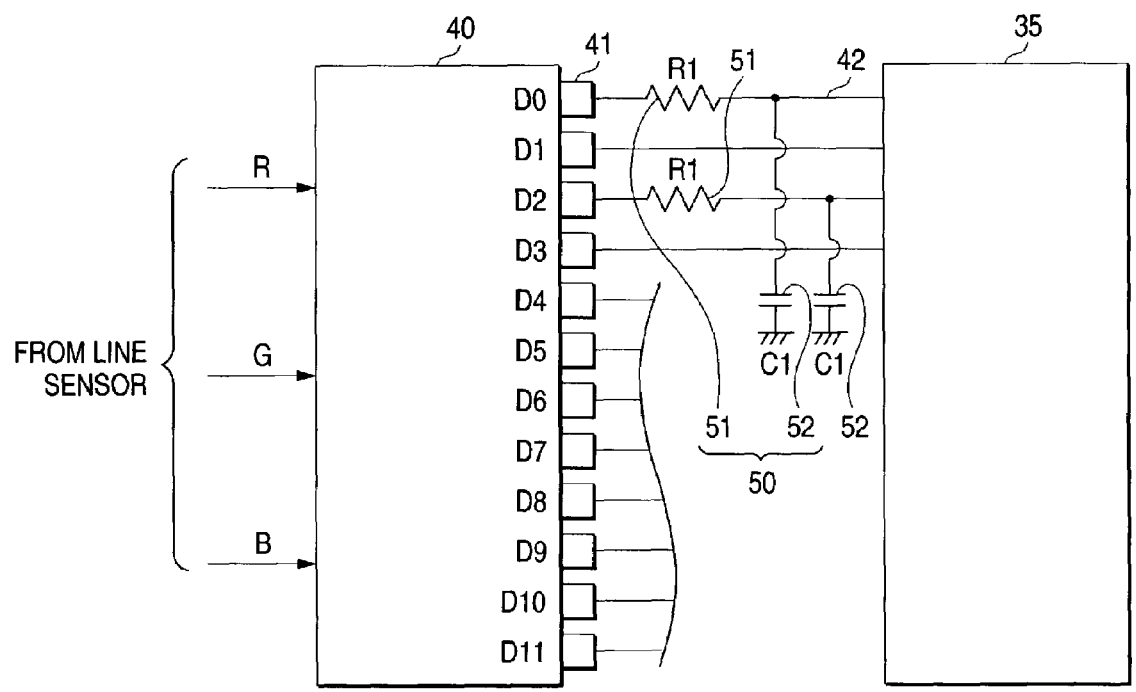
FIG. 1 is a schematic drawing to show an AID conversion section, an image data generation section, and delay circuits of an image reader according to an embodiment of the invention.

As shown in FIG. 1, electric signals corresponding to the colors of R (red), G (green), and B (blue) are input from the line sensor 25 to the A/D conversion section 40. In FIG. 1, the buffer 26 is not shown.

The A/D conversion section 40 generates digital electric signal of a gradation of plurality of steps based on the voltage value of the analog electric signal input from the line sensor 25. In the embodiment, the gradation of the digital electric signal output from the A/D conversion section 40 is a 4096-step gradation represented by 12 bits ($2^{12}$).

The A/D conversion section 40 is provided with a plurality of output pins 41. As the output pins 41, 12 pins of D0 to D11 (12-bit output) are provided corresponding to the output value of the digital electric signal output from the A/D conversion section 40.

The output pins 41 of the A/D conversion section 40 and input pins of the image data generation section 35 are electrically connected through connection lines 42. That is, the A/D conversion section 40 and the image data generation section 35 are connected through the 12 connection lines 42.

The delay circuit 50 is connected to alternate lines of the 12 connection lines. The delay circuit 50 is a circuit made up of a resistance element 51 and a capacitor element 52. The all resistance elements 51 of the delay circuits 50 have the same resistance and the all capacitor elements 52 of the delay circuits 50 have the same capacitance. The delay circuits 50 each having the resistance element 51 and the capacitor element 52 are placed on the connection lines 42, whereby the speed of the electric current flowing through the connection line 42 changes and the output timings of the digital electric signals from the adjacent output pins differ.

A clock signal is supplied to the A/D conversion section 40 from a clock signal supply unit (not shown). The A/D conversion section 40 outputs a digital electric signal in synchronization with the supplied clock signal. A high or low signal is output from the output pin 41 of the A/D conversion section 40 in synchronization with the clock signal.

Figure 3:
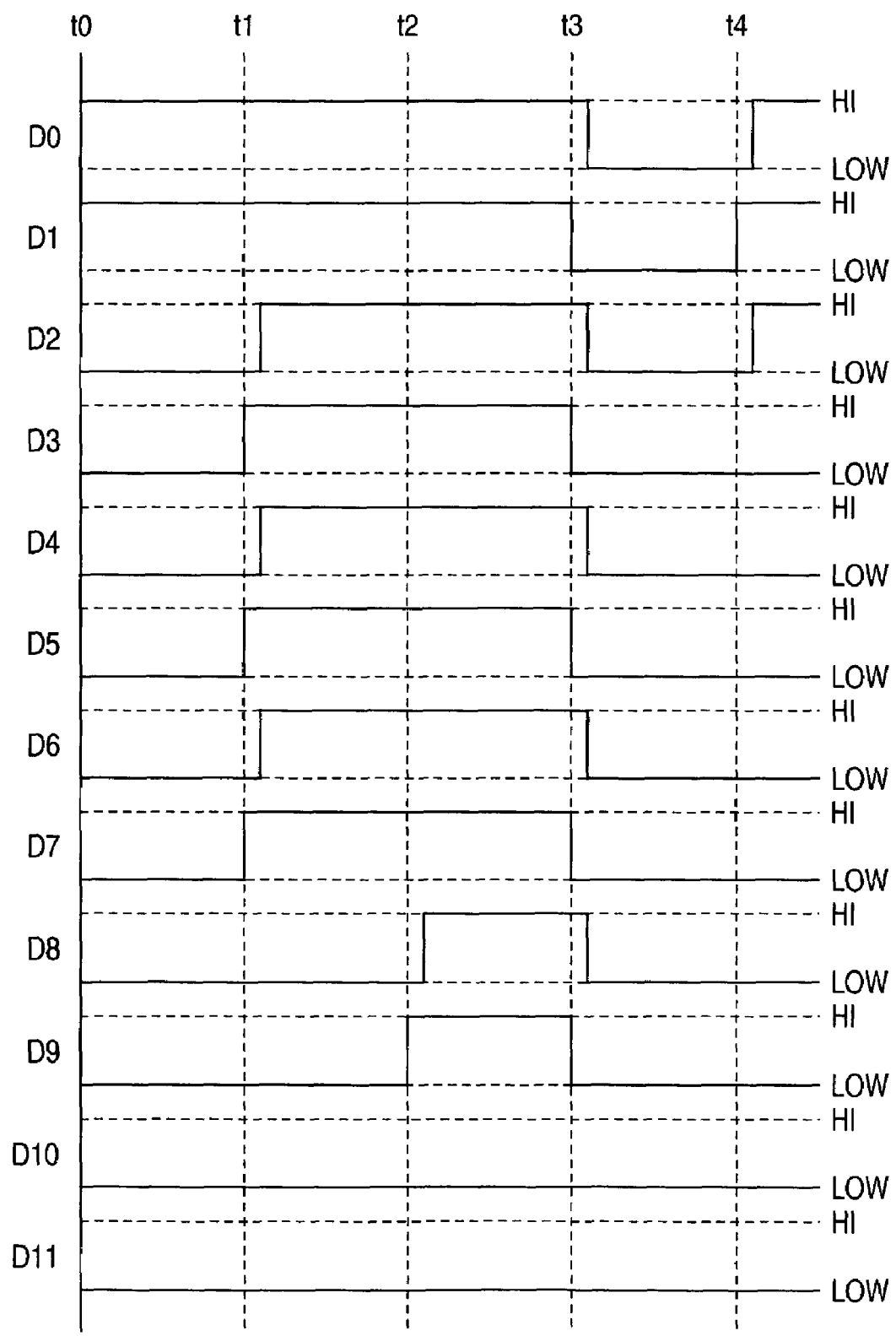
FIG. 3 is a schematic drawing to show digital electric signals output from the A/D conversion of the image reader according to the embodiment of the invention.
Figure 4:
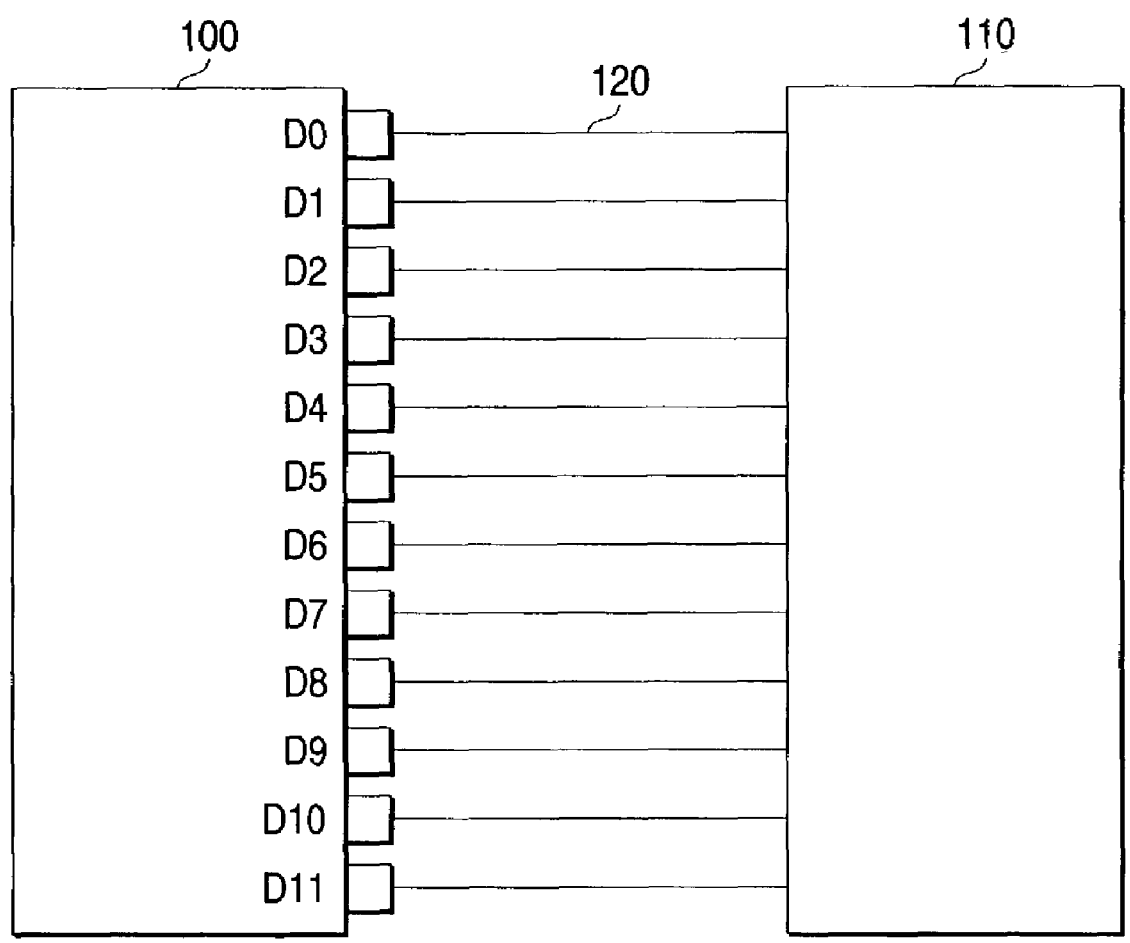
FIG. 4 is a schematic drawing to show an A/D conversion section and an image data generation section of an image reader in a related art.

Assume that a high signal is output from the two output pins D0 and D1 and a low signal is output from the ten output pins D2 to D11 in synchronization with the clock signal as the output gradation of the digital electric signal output from the A/D conversion section 40, for example, at t0 as shown in FIG. 3.

Further assume that the output gradation of the digital electric signal output from the A/D conversion section 40 changes at t1 and a high signal is output from the eight output pins D0 to D7 and a low signal is output from the four output pins D0 to D11. At this time, the six output pins of D2 to D7 make a low to high transition in synchronization with the clock signal.

If the delay circuits 50 are not placed on the connection lines 42 connecting the A/D conversion section 40 with the image data generation section 35 as in the related art, the digital electric signals output from the adjacent output pins make a low to high or high to low transition at the same time in synchronization with the clock signal. Thus, EMI occurring when the digital electric signal makes a low to high or high to low transition is amplified.

In contrast, as the delay circuits 50 are placed, the digital electric signals output from the adjacent pins, such as D0 and D1 or D1 and D2, produce a slight time lag as shown in FIG. 3. Thus, the digital electric signals output from the adjacent pins do not make a low to high or high to low transition at the same time in synchronization with the clock signal. Consequently, amplification degree of EMI is decreased. The tolerance of the time lag produced in the electric signals output by the delay circuits 50 needs to be within several nanoseconds although it depends on the specifications of the image data generation section. For example, with an RC circuit made up of a resistance element and a capacitor element, a resistance element having a resistance of several hundred ohms and a capacitor element having a capacitance of several tens of picofarads are applied, whereby the delay time can be set to about several nanoseconds.

Next, the operation of the described image reader 1 is as follows:

The user places the original 2 to be read on the original bed 11 and gives a read start command of the original 2 to the image reader 1 through a driver program for controlling the image reader 1, such as TWAIN, started in the personal computer 3.

Upon reception of the read start command of the original 2 from the user, the CPU 31 turns on the light source 22 The CPU 31 controls the driver 21 for moving the carriage 20 at constant speed in the subscanning direction. Light reflected on the original 2 is made incident on the line sensor 25 and the incident light is converted into charges for storage. The stored charges are transferred to a shift register (not shown) of the line sensor 25 by a drive signal generated every predetermined time, and one-line electric signal is output from the line sensor 25. The digital image data corrected by the image data generation section 35 is output via the interface 14 to the personal computer 3.

While the carriage 20 is moved at constant speed in the subscanning direction, the above-described processing is repeated for reading the original 2.

As described above, according to the image reader 1 according to the embodiment of the invention, the delay circuits 50 are placed on the connection lines 42 connecting the A/D conversion section 40 and the image data generation section 35. Accordingly, the output timings of the digital electric signals differ and simultaneous output of the digital electric signals from the A/D conversion section 40 is prevented. Thus, the digital electric signals output from the A/D conversion section 40 does not make a low to high or high to low transition at the same time, so that amplifying of EMI can be decreased. Therefore, the image data generated in the image data generation section 35 can be prevented from containing noise and the quality of the image read through the image reader 1 can be improved.

EMI occurs as the digital electric signals output from the adjacent pins are synchronized with each other. Thus, in the embodiment, each delay circuit 50 is placed on alternate lines of the connection lines 42, whereby amplifying of EMI can be decreased. Since the resistance element 51 and the capacitor element 52 disposed as each delay circuit 50 are small and inexpensive, an increase in the manufacturing cost of the image reader 1 can be suppressed. The delay circuits 50 can be placed on the board of the image reader 1 and a filter or a shield for shielding EMI is not required. Thus, the manufacturing cost is not increased and in addition, the space for placing a filter or a shield need not be provided in the image reader 1 and the image reader 1 is not upsized.

In the embodiment of the invention described above, the case where a reflection original of paper, etc., is read using the image reader of flat bed type has been described. However, the invention is not limited to the image reader of flat bed type and can also be applied to an image reader of sheet feed type and image readers for reading not only reflection originals, but also transparent originals of films, etc.

What is claimed is:

1. An image reader comprising:
   an image pickup device on which light from an original is made incident, for outputting an analog electric signal responsive to the strength of the incident light;
   an A/D conversion section having a plurality of output pins for converting the analog electric signal output from the image pickup device into a digital electric signal;
   an image data generation section for generating digital image data from the digital electric signal output from the A/D conversion section; and
   delay circuits corresponding to at least one output pin and placed between the A/D conversion section and the image data generation section for making different output timings of the digital electric signals output from the A/D conversion section, wherein at least one output pin is not associated with any delay circuit.

2. The image reader according to claim 1, wherein the output pins are provided in response to a number of output bits.

3. The image reader according to claim 1, wherein each of the delay circuits is placed on alternate lines of connection lines connecting the plurality of output pins with the image data generation section.

4. The image reader according to claim 3, wherein each of the delay circuits has a resistance element and a capacitor element.

5. The image reader according to claim 3, wherein each of the delay circuits has a resistance element and a capacitor element and the resistance elements have the same resistance and the capacitance elements have the same capacitance.

* * * * *